United States Patent
He

(10) Patent No.: US 9,823,267 B2
(45) Date of Patent: Nov. 21, 2017

(54) ACCELEROMETER WITH LITTLE CROSS EFFECT

(71) Applicant: SEMICONDUCTOR MANUFACTURING INTERNATIONAL (SHANGHAI) CORPORATION, Shanghai (CN)

(72) Inventor: Zhaowen He, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 197 days.

(21) Appl. No.: 14/951,330

(22) Filed: Nov. 24, 2015

(65) Prior Publication Data
US 2016/0187372 A1 Jun. 30, 2016

(30) Foreign Application Priority Data
Dec. 25, 2014 (CN) .......................... 2014 1 0843881

(51) Int. Cl.
*G01P 15/125* (2006.01)
*G01P 15/08* (2006.01)

(52) U.S. Cl.
CPC ...... *G01P 15/125* (2013.01); *B81B 2203/051* (2013.01); *G01P 2015/0814* (2013.01)

(58) Field of Classification Search
CPC .......... G01P 15/125; G01P 2015/0814; B81B 2203/051
See application file for complete search history.

(56) References Cited

U.S. PATENT DOCUMENTS

| | | | | |
|---|---|---|---|---|
| 6,393,913 | B1* | 5/2002 | Dyck ................. | G01P 15/0802 333/186 |
| 2008/0150554 | A1* | 6/2008 | Wang ................ | G01C 19/5755 324/686 |
| 2012/0186346 | A1* | 7/2012 | McNeil ............... | G01P 15/125 73/514.32 |
| 2014/0284603 | A1* | 9/2014 | Su ....................... | B81B 3/0008 257/49 |
| 2015/0056733 | A1* | 2/2015 | Lo ....................... | B81C 1/0069 438/51 |
| 2016/0257557 | A1* | 9/2016 | Wu ...................... | B81B 3/0051 |

FOREIGN PATENT DOCUMENTS

JP 2012152890 A * 8/2012 ............ G01P 15/125

* cited by examiner

*Primary Examiner* — Francis Gray
(74) *Attorney, Agent, or Firm* — Kilpatrick Townsend & Stockton LLP

(57) ABSTRACT

A microelectromechanical system (MEMS) acceleration sensor includes a mass bar, a first spring disposed on a first set of opposite sides of the mass bar and configured to secure the mass bar in a first direction, an interdigital structure disposed along a second set of opposite sides of the mass bar in a second direction perpendicular to the first direction, a detection electrode corresponding to the interdigital structure, and a second spring disposed on the second set of opposite sides and configured to secure the mass bar in the second direction. The first spring has a frame shape, and the second spring has an S-shape. Through the second spring, the acceleration sensor is less sensitive to acceleration on the other direction, so that the detection performance of the acceleration sensor is improved.

11 Claims, 8 Drawing Sheets

ACCELEROMETER WITH LITTLE CROSS EFFECT

CROSS-REFERENCES TO RELATED APPLICATIONS

The present application claims priority to Chinese patent application No. 201410843881.3, filed with the State Intellectual Property Office of People's Republic of China on Dec. 25, 2014, the content of which is incorporated herein by reference in its entirety.

FIELD OF THE INVENTION

The present invention relates to semiconductor devices, and more particularly to a microelectromechanical system (MEMS) accelerometer and methods of manufacturing the same.

BACKGROUND OF THE INVENTION

MEMS accelerometer devices have low production costs, good device matching performance, and manufacturing processes compatible with IC process technology, so that MEMS accelerometer devices have been widely studied. The interdigital capacitive sensors with high sensitivity, good linearity, and low noise are the most commonly used MEMS accelerometer devices.

Although three-axis acceleration sensors are the research focus of MEMS accelerometers, however, single-axis acceleration sensors still play a decisive role, because single-axis accelerator technology is easy to design, and can have simple processes and stable performance. For example, an acceleration sensor for automatic releasing of airbags is a type of single-axis acceleration sensor, which should have a high directional sensitivity, high acceleration range (e.g., the range of airbag acceleration sensors is at least above 50 g).

In order to avoid false activation of an airbag, an important feature of such acceleration sensor is that it is not sensitive to the influence of other directional accelerations. For example, the measurement values of the X-axis acceleration should not be significantly deviated due to the acceleration in the Y-axis or Z-axis.

FIG. 1 is a top plan view of a structure of a uniaxial airbag acceleration sensor, as known in the prior art. The acceleration sensor includes a rectangular mass bar 101, a frame-shaped spring 102 disposed on opposite short sides of rectangular mass bar 101 for securing the rectangular mass bar, an interdigital structure 103 disposed on each long side of rectangular mass bar 101, and an interdigital electrode 1031 corresponding to interdigital structure 103. This structure of an acceleration sensor is vulnerable to cross effects of acceleration in other directions and tends to cause false activation of the airbag.

The conventional design of an MEMS acceleration sensor may be mechanically modeled using the following simulation data: mass 101 has a thickness of 50 µm, a length of 1000 µm, a width of 200 µm. Spring 102 disposed on both narrow sides of mass 101 is configured to secure the mass bar and has a width of 7 µm. Mass 101 has an elastic modulus of $1.69 \times 10^{11}$ Pa, a Poisson's ratio (PRXY) of 2.3, a density (DENS) of $1.4 \times 10^3$ kg/m$^3$. For simplicity, the interdigital structure disposed along the long sides of mass bar 101 is not included in the simulation because its mass is negligible and does not affect the movement of mass bar 101.

In the case where the accelerations in the X- and Y-axes are 30 g, simulation data of the mechanic model is as follows: the displacement of mass bar 101 in the X-axis is 0.119 µm, and the displacement of mass bar 101 in the X-axis is 0.114 µm. Obviously, such large displacement in the Y-axis will adversely affect the acceleration detection of the MEMS acceleration device in the direction of the X-axis.

Thus, the structure of a conventional single-axis acceleration sensor is susceptible to effects of accelerations in other directions (e.g., the Y-axis direction) other than the predetermined direction (e.g., the X-axis direction), and the acceleration detection of the acceleration sensor will be negatively affected, ultimately causing an incorrect operation of the acceleration sensor control device (e.g., an airbag indicator lamp). Thus, there is a need to develop a new structure for the acceleration sensor to solve the above-described problems.

BRIEF SUMMARY OF THE INVENTION

Embodiments of the present invention provide a microelectromechanical system (MEMS) acceleration sensor. The acceleration sensor includes a mass bar, a first spring disposed on a first set of opposite sides of the mass bar and configured to secure the mass bar in a first direction, an interdigital structure disposed along a second set of opposite sides of the mass bar in a second direction perpendicular to the first direction, a detection electrode corresponding to the interdigital structure, and a second spring disposed on the second set of opposite sides and configured to secure the mass bar in the second direction. The first spring having a frame-shape, and the second spring has an S-shape.

In one embodiment, the mass bar has a rectangular shape.

In one embodiment, the second spring is disposed symmetrically about an axis of the mass bar in the second direction.

In one embodiment, the second spring is disposed in a middle section of the interdigital structure or in the middle section of the mass bar between the second set of opposite sides.

In one embodiment, the mass bar, the first spring, the interdigital structure, the detection electrode, and the second spring each comprise a same material.

Embodiments of the present invention also provide a method for manufacturing a microelectromechanical system (MEMS) acceleration sensor. The method includes providing a substrate, forming a sacrificial layer on the substrate, forming a sensor material layer on the sacrificial layer, and patterning the sensor material layer using an etching process to form the accelerator sensor. The accelerator sensor may comprise a mass bar, a first spring disposed on a first set of opposite sides of the mass bar and configured to secure the mass bar in a first direction, the first spring having a frame shape, an interdigital structure disposed along a second set of opposite sides of the mass bar in a second direction, the second direction being perpendicular to the first direction, a detection electrode corresponding to the interdigital structure, a second spring disposed on the second set of opposite sides and configured to secure the mass bar in the second direction, the second spring having an S-shape. The method also includes removing a portion of the sacrificial layer located below the mass bar, the first spring, the interdigital structure, and the second spring.

In one embodiment, the second spring is disposed symmetrically about an axis of the mass bar in the second direction.

Embodiments of the present invention also provide a method for manufacturing a microelectromechanical system (MEMS) acceleration sensor. The method includes forming a sacrificial layer on a substrate, patterning a trench in a region where the to-be-formed acceleration sensor is connected to the substrate, forming a connection member in the trench, forming a sensor material layer on the substrate and the connection member, patterning the sensor material layer using an etching process to form the acceleration sensor, and removing the sacrificial layer.

The following detailed description together with the accompanying drawings will provide a better understanding of the nature and advantages of the present invention.

DETAILED DESCRIPTION OF THE INVENTION

Figure 1:
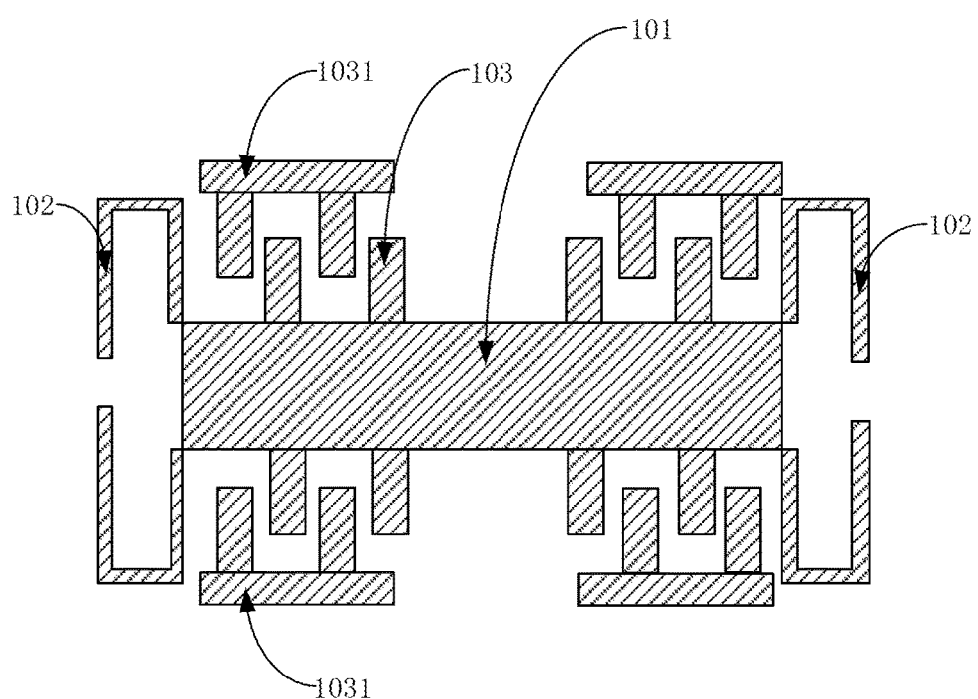
FIG. 1 is a plan view illustrating a structure of a single-axis acceleration sensor, as known in the art.

The present invention will be described with respect to particular embodiments and with reference to certain drawings but the invention is not limited thereto but only by the claims. Any reference signs in the claims shall not be construed as limiting the scope. The drawings described are only schematic and are non limiting. In the drawings, the size of some of the elements may be exaggerated and not drawn on scale for illustrative purposes.

It should be understood that prepositions, such as "on", "side" (as in "sidewall"), "below" "above", "higher", "lower", "over" and "under" are defined with respect to the conventional plane or surface being on the top surface of the wafer or substrate, regardless of the orientation of the wafer or substrate. It will be understood that these terms are intended to encompass different orientations of the device in addition to the orientation depicted in the figures.

It should be understood that the drawings are not drawn to scale, and similar reference numbers are used for representing similar elements. As used herein, the terms "example embodiment," "exemplary embodiment," and "present embodiment" do not necessarily refer to a single embodiment, although it may, and various example embodiments may be readily combined and interchanged, without departing from the scope or spirit of the present invention. Furthermore, the terminology as used herein is for the purpose of describing example embodiments only and is not intended to be a limitation of the invention.

It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. in contrast, the term "consisting of" when used in this specification, specifies the stated features, steps, operations, elements, and/or components, and precludes additional features, steps, operations, elements.

It will be further understood that the terms such as "bottom", "below", "underneath," "top" and "above" may be used herein for exemplary purposes only, to illustrate the relative positioning or placement of certain components, to indicate a first and a second component or to do both.

In this respect, as used herein, the term "in" may include "in" and "on", and the terms "a", "an" and "the" may include singular and plural references. Furthermore, as used herein, the term "by" may also mean "from", depending on the context. Furthermore, as used herein, the term "if" may also mean "when" or "upon", depending on the context. Furthermore, as used herein, the words "and/or" may refer to and encompass any possible combinations of one or more of the associated listed items.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

In the following description, numerous specific details are set forth in order to provide a thorough understanding of the present invention. It will be apparent, however, to one skilled in the art that the present invention may be practiced without some or all of these specific details. In other instances, well-known process steps have not been described in detail in order not to unnecessarily obscure the present invention.

First Embodiment

Figure 2:
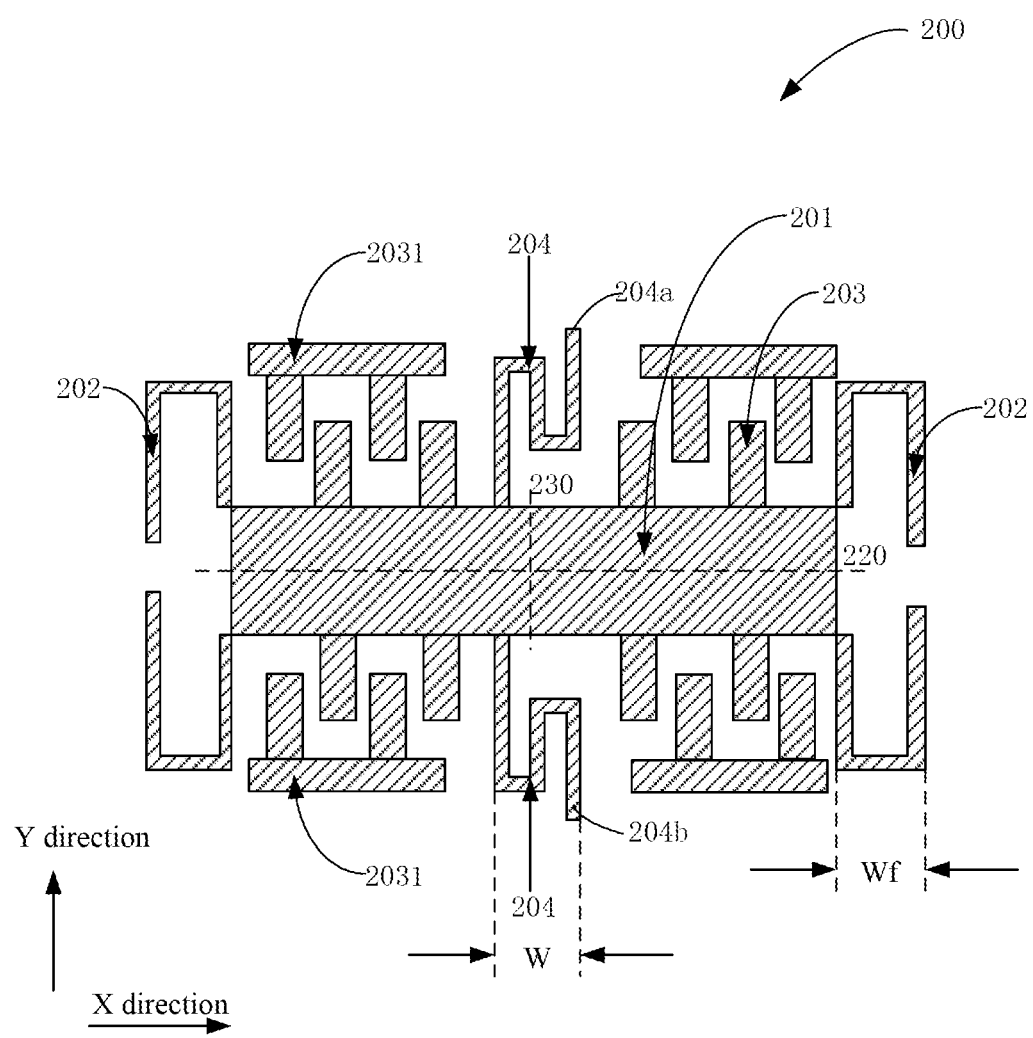
FIG. 2 is a plan view illustrating a structure of an acceleration sensor according to a first embodiment of the present invention.

FIG. 2 is a plan view illustrating a structure of an acceleration sensor 200 according to a first embodiment of the present invention. As shown in FIG. 2, acceleration sensor 200 includes a rectangular mass bar 201 having two short sides and two long sides, a first spring 202 disposed on the opposite short sides (a first set of opposite sides) of rectangular mass bar 201 and configured to secure the mass bar in a first direction, an interdigital (comb-shaped teeth) structure 203 disposed on the opposite long sides (a second set of opposite sides) of rectangular mass bar 201, and a detection electrode 2031 corresponding to interdigital structure 203. Detection electrode 2031 has a structure that matches interdigital structure 203. Detection electrode 2031 has a fixed position (i.e., non-movable with regard to the mass bar) configured to detect the movement of mass bar 201. Acceleration sensor 200 further includes a second spring 204 disposed in the center location of the mass bar along the long sides and configured to stabilize mass bar 201 in a second direction that is perpendicular to the first direction.

Second spring 204 has an S-shape or a meander shape. In an exemplary embodiment, second spring 204 is located within interdigital structure 203, as shown in FIG. 2. Preferably, second spring 204 is disposed symmetrically about a first axis 220 of mass bar 201 along the first direction. In an embodiment, second spring 204 is disposed in a middle section (e.g., center portion) of mass bar 201.

Referring to FIG. 2, first spring 202 has a frame shape. Preferably, first spring 202 is disposed symmetrically about a second axis 230 of mass bar 201 along the second direction.

In some embodiments, mass bar 201 may have other shapes other than a rectangular shape.

In one embodiment, mass bar 201, first spring 202, interdigital structure 203, detection electrode 2031, and second spring 204 may be made of various suitable materials. In an exemplary embodiment, mass bar 201, first spring 202, interdigital structure 203, detection electrode 2031, and second spring 204 are made of the same material, e.g., polysilicon.

Acceleration sensor 200 of the present invention is less sensitive to the acceleration in the other direction (e.g., the second direction) through the second spring (e.g., the S-shaped or meander-shaped spring) so that the detection performance of the acceleration sensor is improved. Accordingly, the probability of incorrect operation of a control device of the acceleration sensor (e.g., airbag indication lamp) can be reduced.

In the embodiment, the MEMS acceleration sensor is generally provided on the substrate, and may includes additional components other the ones that have been described. The acceleration sensor may also include other suitable components and not limited to those already described.

In the embodiment, the mechanical model of the MEMS acceleration sensor may have the following simulation data: mass bar 201 has a thickness of 50 µm, a length of 1000 µm, a width of 200 µm. The spring disposed on opposite short sides (the first set of opposite sides) of mass 101 to secure the mass bar in the first direction has a width of 7 µm. Mass 101 has an elastic modulus of $1.69 \times 10^{11}$ Pa, a Poisson's ratio (PRXY) of 2.3, a density (DENS) of $2.4 \times 10^3$ kg/m$^3$. For simplicity, the interdigital (comb-tooth shaped) structure disposed along the opposite long sides (the second set of opposite sides) of mass bar 201 is not included in the simulation because its mass is negligible and does not affect the movement of the mass bar.

Referring still to FIG. 2, spring 204 includes two S-shaped springs 204a, 204b disposed symmetrically on opposite long sides (the second set of opposite sides) of mass bar 201. Spring 204 has a small rigidity in the X direction (drive direction) and a large rigidity in the Y direction. In an embodiment, the width "W" (measured along the long side of the mass bar) of the second spring 204 is substantially equal to the width "Wf" of the first spring 202 in order to provide the necessary rigidity in the Y direction to reduce the effect of the acceleration in the Y direction.

In the case where the accelerations in the X- and Y-axes are 30 g, the simulation data of the mechanical model is: the displacement of the mass bar 201 in the X-axis is 0.117 µm, and the displacement of the mass bar 201 in the Y-axis is 0.0098 µm. Obviously, comparing to the conventional acceleration sensor having a displacement in the Y-axis of 0.114 µm, the displacement of the acceleration sensor in the Y-axis has been significantly reduced. In other words, the acceleration sensor of the present embodiment may not significantly affect the sensitivity in the X-axis but significantly reduce the effect of the acceleration in the Y-Axis.

Second Embodiment

Figure 3A:
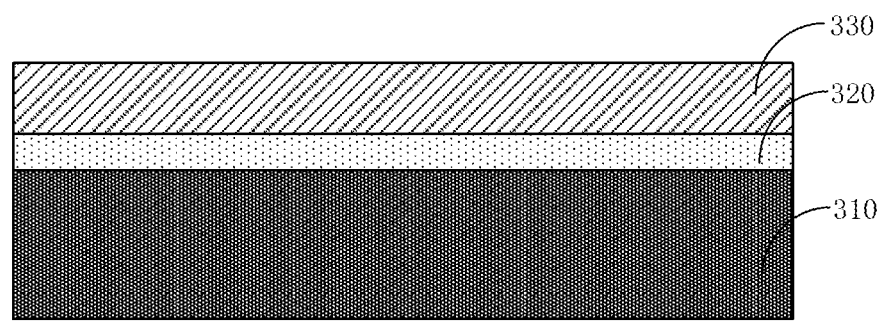
FIGS. 3A, 3B, and 3C are cross-sectional view and plan views illustrating manufacturing processes and a structure of an acceleration sensor according to a second embodiment of the present invention.
Figure 3B:
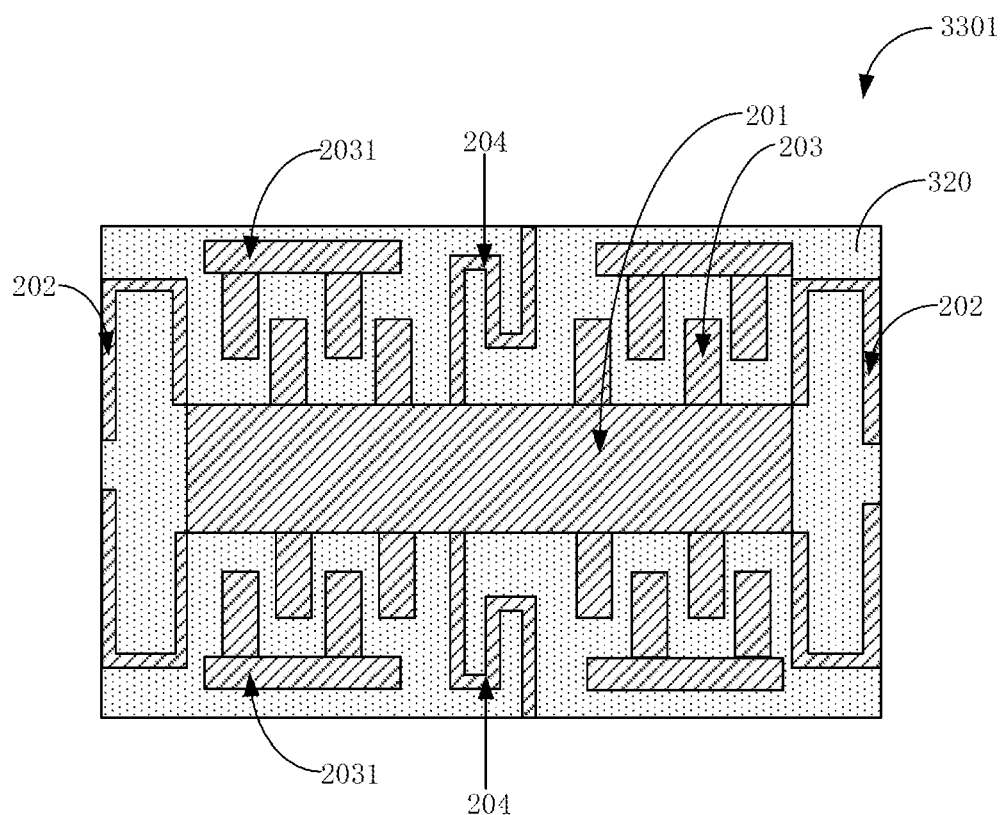
Figure 3C:
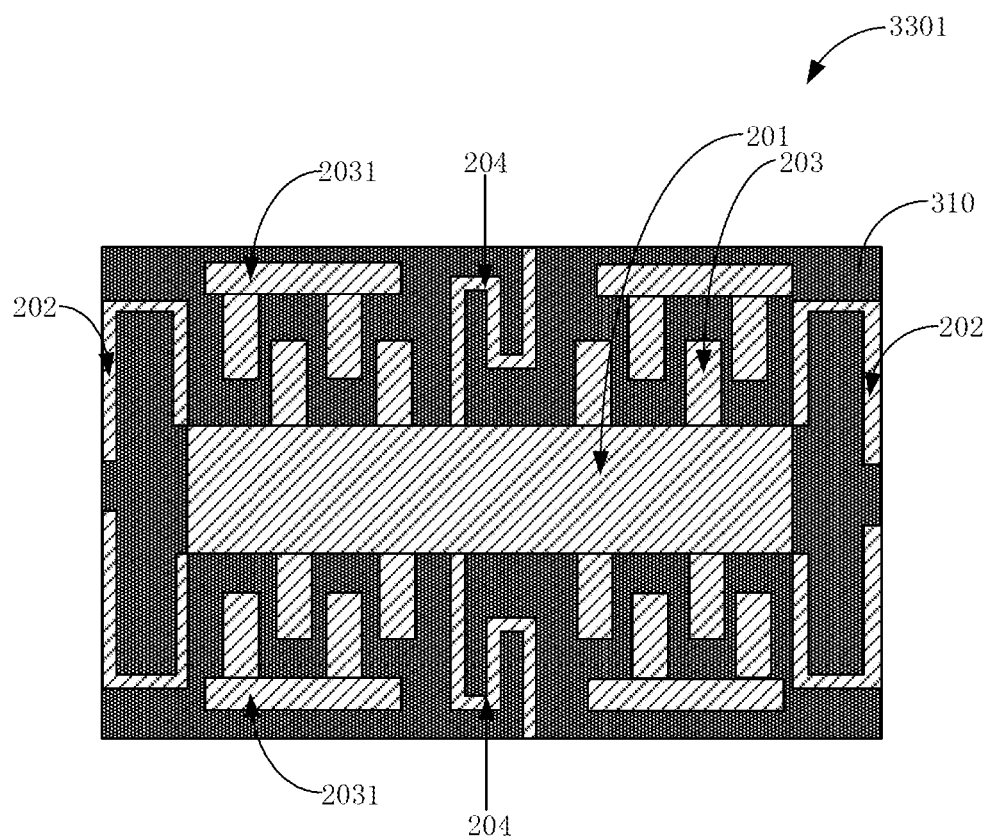

Embodiments of the present invention provide a method for manufacturing a MEMS acceleration sensor. The manufacturing method will be described in conjunction with FIGS. 3A through 3C. FIG. 3A is a cross-sectional view, and FIGS. 3B and 3C are plan view of a structure of the MEMS acceleration sensor according to some embodiments of the present invention.

The method may include step A1, which includes providing a substrate 310, forming a sacrificial layer 320 on substrate 310, and forming a sensor material layer 330 on sacrificial layer 320. as shown in FIG. 3A.

Substrate 310 may be single crystal silicon, polycrystalline silicon, or other suitable materials. Sacrificial layer 320 may be a silicon oxide or other suitable material. Sensor material layer 330 may be any material suitable for forming an acceleration sensor, such as polysilicon.

In some embodiments, substrate 310, sacrificial layer 320, and sensor material layer 330 may form an SOI (silicon-on-insulation) substrate, so that step Al may be implemented by providing an SOI substrate.

The method also includes step A2 for selectively etching sensor material layer 330 to form an acceleration sensor 3301, as shown in FIG. 3B. Referring to FIG. 3B, mass bar 201, first spring 202, interdigital structure 203, and second spring 204 are patterned out of sensor material layer 330.

The structure of acceleration sensor 3301 is similar to the structure shown in the above-described first embodiment. As shown in FIG. 3B, acceleration sensor 3301 includes a rectangular mass bar 201 having two long sides and two short sides, a first spring 202 disposed on the opposite short sides of rectangular mass bar 201 and configured to secure the mass bar in a first direction, an interdigital structure 203 disposed along the opposite long sides of rectangular mass bar 201, and a detection electrode 2031 corresponding to interdigital structure 203. Detection electrode 2031 has a structure that matches interdigital structure 203. Acceleration sensor 3301 further includes a second spring 204 disposed in the center portion (middle section) of the long sides of mass bar 201 and configured to secure the mass bar in a second direction that is perpendicular to the first direction.

Second spring 204 has an S-shape. In an exemplary embodiment, second spring 204 is located in interdigital structure 203. Preferably, second spring 204 is disposed symmetrically about an axis of the mass bar in the first direction (i.e., along the long sides of mass bar 201 or X-axis).

First spring 202 has a rectangular frame shape. Preferably, first spring 202 is disposed symmetrically about an axis of the mass bar (i.e., along the short sides of mass bar 201 or Y-axis).

The method also includes step A3 for removing a portion of sacrificial layer 320 disposed below (underneath) acceleration sensor 3301 (including mass bar 201, first spring 202, interdigital structure 203, and second spring 204), as shown in FIG. 3C. It is noted that the detection electrode 2031 is electrically insulated and physically separated from interdigital structure 203.

In an embodiment, the portion of sacrificial layer 320 underneath acceleration sensor 3301 (comprising mass bar 201, first spring 202, interdigital structure 203, and second spring 204) can be removed using an etching process, and/or other suitable processes known in the art and will not be described in detail herein.

This completes the description of the key steps of the manufacturing method of an acceleration sensor of the first embodiment. As will be appreciate by those of skill in the art, the manufacturing method is not limited to the above-described steps and may include other steps.

The manufacturing method of an acceleration sensor according to the embodiment of the present invention does not increase the complexity of the existing manufacturing processes with respect to the prior art. Because of the accelerator sensor includes the second spring disposed along the long sides of the mass bar, the resulting accelerator sensor is not affected by accelerations from other directions so that the direction detection performance of the accelerator sensor is improved.

Figure 4A:
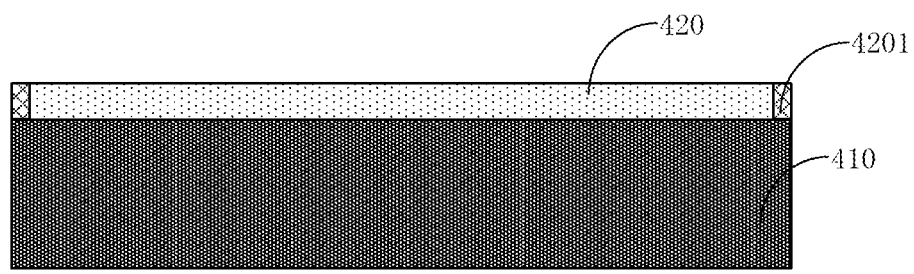
FIGS. 4A, 4B, 4C, 4D, 4E, and 4F are cross-sectional views and plan views illustrating manufacturing processes and a structure of an acceleration sensor according to another second embodiment of the present invention.
Figure 4B:
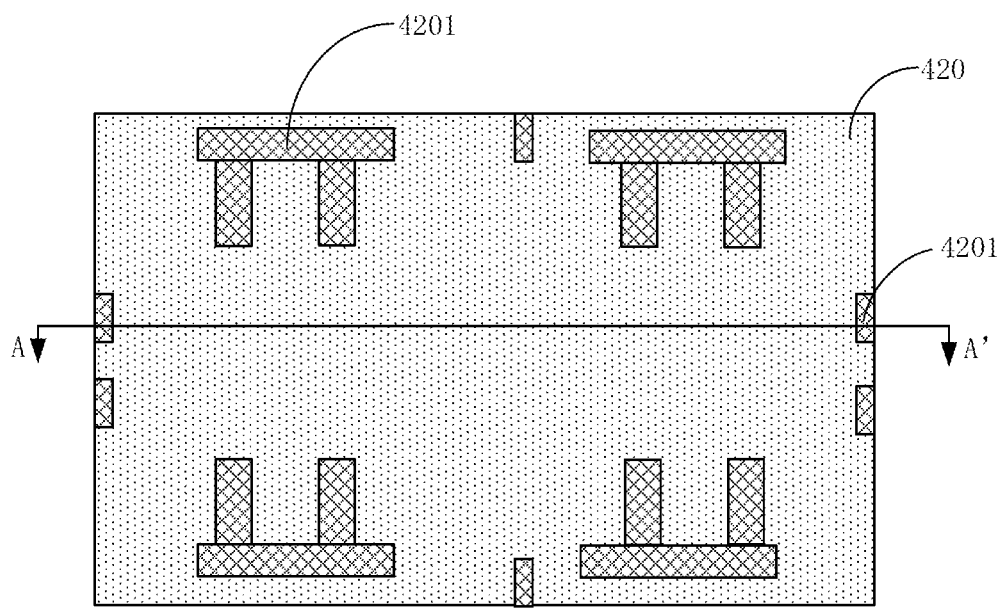
Figure 4C:
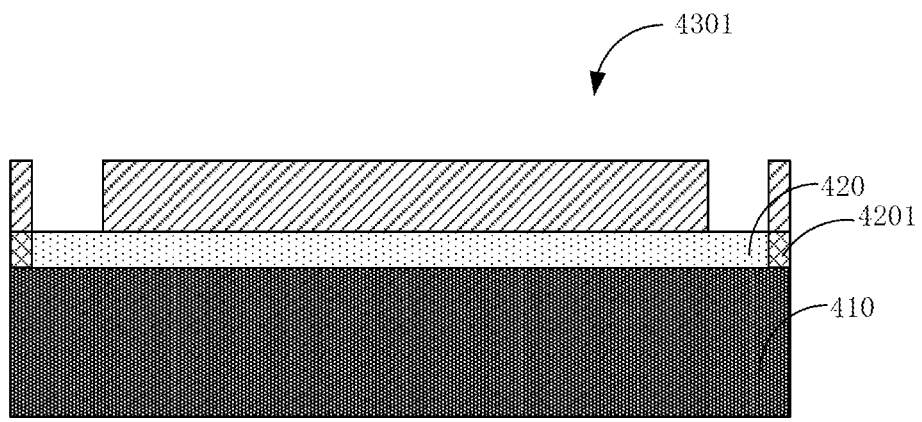
Figure 4D:
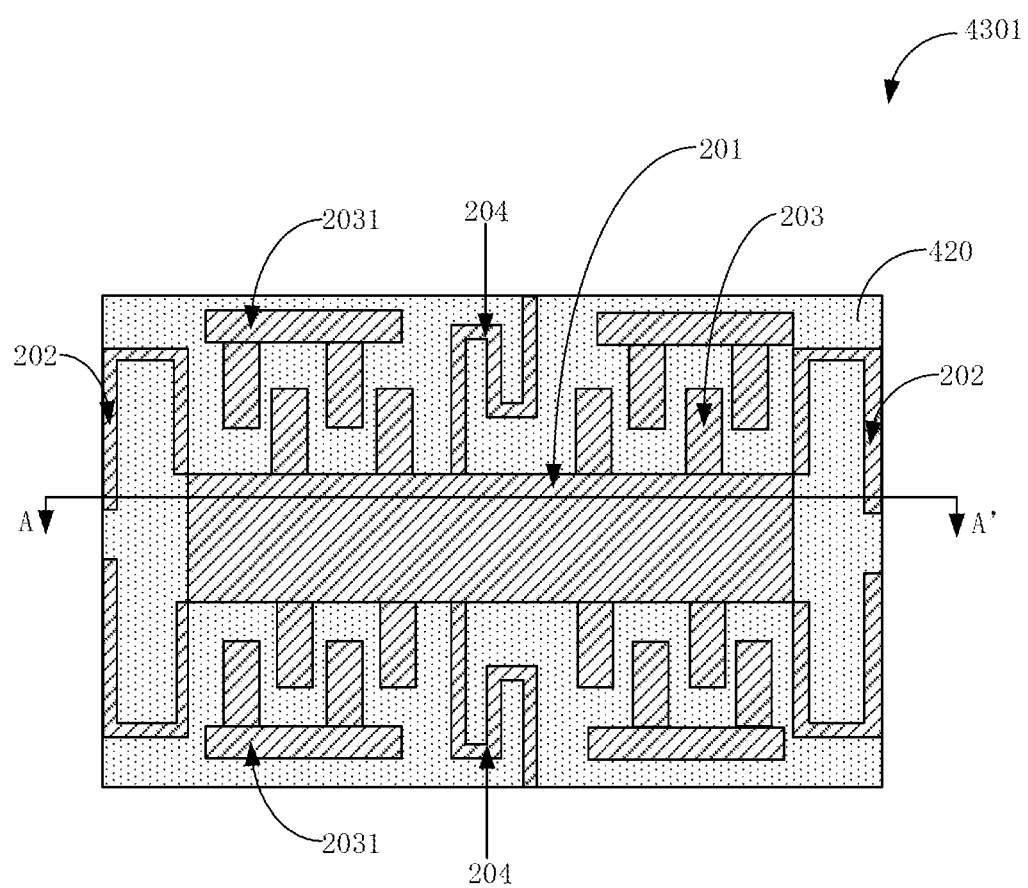
Figure 4E:
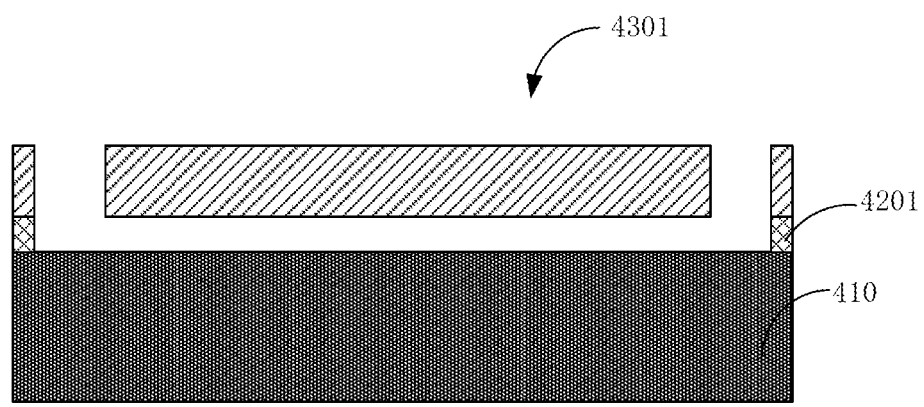
Figure 4F:
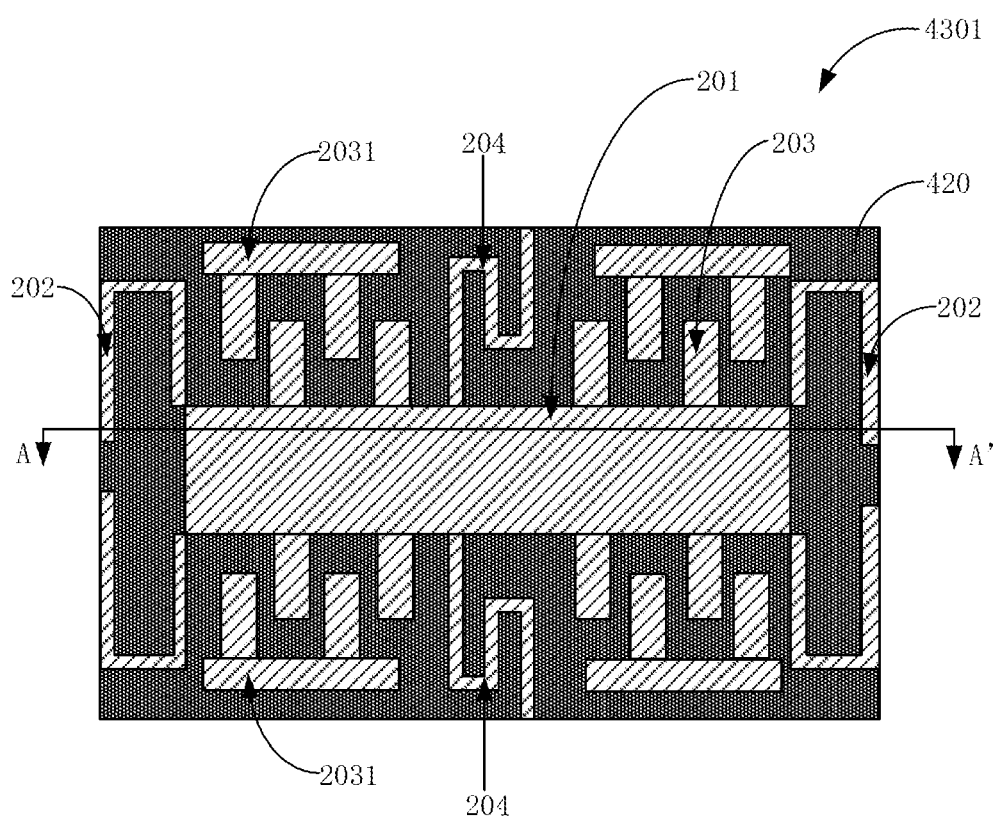

FIGS. 4A through 4F are cross-sectional views and plan views illustrating intermediate stages of a structure of an accelerator sensor according to some embodiments of the present invention. FIG. 4A is a cross-sectional view taken along the line AA' of FIG. 4B. FIG. 4B is a plan view illustrating a stage of the accelerometer sensor structure. FIG. 4C is a cross-sectional view taken along the line AA' of FIG. 4D; FIGS. 4D is a plan view illustrating a stage of the accelerometer sensor structure. FIG. 4E is a cross-sectional view taken along the line AA' of FIG. 4D, and FIGS. 4F is a plan view of a structure of the MEMS acceleration sensor.

Referring to FIG. 4A and FIG. 4B, a manufacturing method for an acceleration sensor includes:

B1: providing a substrate 410, forming a sacrificial layer 420 on substrate 410, patterning sacrificial layer 420 to form a trench in a region for a connection member 4201 configured to connect the to be formed accelerator sensor with the substrate, and forming the connection member in the trench, as shown in FIG. 4B.

Substrate 410 may be single crystal silicon, polycrystalline silicon, or other suitable materials. Sacrificial layer 420 may be a silicon oxide or other suitable material.

Connection member 4201 and sacrificial layer 420 have a high etch selectivity. In an exemplary embodiment, the upper surface of connection member 4201 and the upper surface of sacrificial layer 420 are located in the same plane, i.e., the surface of connection member 4201 is flush (coplanar) with the surface of sacrificial layer 420.

For example, sacrificial layer 420 can be patterned for forming a trench using an etching process or other suitable processes. Forming connection member 4201 in the trench may include filling a connection material layer in the trench and removing the excess connection material using a chemical mechanical polishing (CMP) process. The connection material layer is a conductive layer, such as polysilicon.

B2: forming a sensor material layer on patterned sacrificial layer 420, and etching the sensor material layer to form an acceleration sensor 4301, as shown in FIG. 4C.

Acceleration sensor 4301 may have a structure that is similar to the structure of the accelerator sensor 200 of the first embodiment. Referring to FIG. 4D, acceleration sensor 4301 includes a rectangular mass bar 201 having two long sides and two short sides, a first spring 202 disposed on the opposite short sides of rectangular mass bar 201 and configured to stabilize the mass bar in a first direction, an interdigital structure 203 disposed on the opposite long sides of rectangular mass bar 201, and a detection electrode 2031 corresponding interdigital structure 203. Detection electrode 2031 has a structure that matches interdigital structure 203. Acceleration sensor 4301 further includes a second spring 204 disposed in the center location of the long sides of the mass bar and configured to secure mass bar 201 in a second direction that is perpendicular to the first direction.

Second spring 204 has an S-shape. In an exemplary embodiment, second spring 204 is located between interdigital structure 203, as shown in FIG. 2. Preferably, second spring 204 is disposed symmetrically on the opposite long sides of mass bar 201.

First spring 202 has a frame shape. Preferably, first spring 202 is disposed symmetrically on the opposite short sides of mass bar 201.

In embodiments of the present invention, a connection member 4201 is formed in the region where the acceleration sensor is connected to the substrate (e.g., the connection of the first spring), as shown in FIGS. 4A through 4D. The acceleration sensor is connected to the remaining portion of the sacrificial layer.

B3: removing sacrificial layer 420, as shown in FIGS. 4E and 4F. Sacrificial layer 420 may be removed using an etching process or other suitable processes. The resulting acceleration sensor will have movable elements (e.g., mass bar 201, first spring 202, second spring 204) floating above the substrate 410. First spring 202 is anchored to the substrate 410 through connection member 4201 located at the two opposite ends in the X direction. Second spring 204 is anchored to the substrate 410 through connection member 4201 located a the two opposite ends in the Y direction in order to provide sufficient rigidity in the Y direction to reduce the effect of the acceleration in the Y direction in the acceleration sensor and to improve the acceleration detection performance in the X direction.

This completes the description of the key steps of the second manufacturing method of an acceleration sensor of the first embodiment. As will be appreciate by those of skill in the art, the manufacturing method is not limited to the above-described steps and may include other steps.

Figure 5:
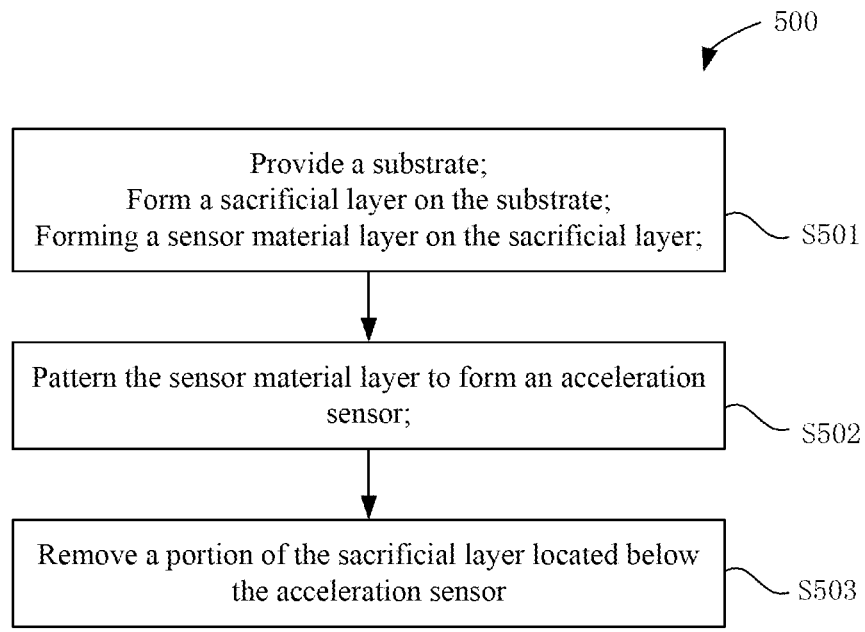
FIG. 5 is a flow chart diagram illustrating the steps of a method for manufacturing an acceleration sensor of FIGS. 3A, 3B, and 3C.

FIG. 5 is a flow chart diagram illustrating the steps of a method 500 for manufacturing an accelerator sensor. Method 500 includes providing a substrate, and forming a sacrificial layer on the substrate, and forming a sensor material layer on the sacrificial layer (S501). Method 500 also includes patterning the sensor material layer using an etching process to form an acceleration sensor (S502). The accelerator sensor may be the acceleration sensor of the first embodiment. Method 500 further includes remove a portion of the sacrificial layer located below the acceleration senor (S503).

Figure 6:
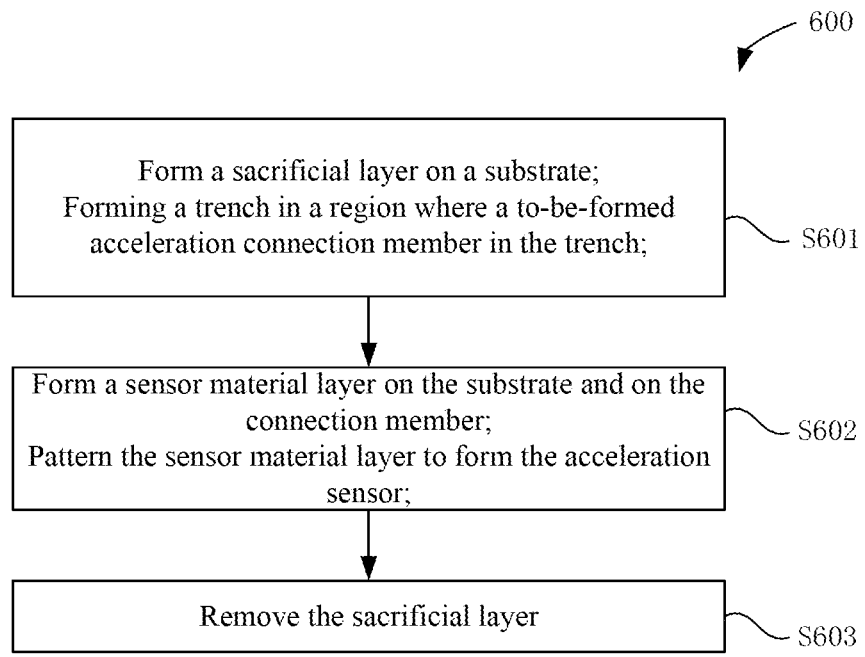
FIG. 6 is a flow chart diagram illustrating the steps of another method for manufacturing an acceleration sensor of FIGS. 4A through 4F.

FIG. 6 is a flow chart diagram illustrating the steps of a method 600 for manufacturing an accelerator sensor.

Method 600 includes forming a sacrificial layer on a substrate, forming a trench in a region where a to-be-formed accelerator sensor is connected to the substrate, and forming a connection member in the trench (S601). Method 600 also includes forming a sensor material layer on the substrate and on the connection member, and patterning the sensor material layer to form the acceleration sensor (S602). Method 600 further include removing the sacrificial layer (S603).

The manufacturing method of an acceleration sensor does not increase the complexity of the existing manufacturing processes with respect to the prior art. Because of the accelerator sensor includes the second spring disposed along the long sides of the mass bar, the resulting accelerator sensor is not affected by accelerations from other directions so that the direction detection performance of the accelerator sensor is improved.

As described above, according to the embodiments of the present invention, the method for manufacturing an accelerator sensor may also include forming a second spring having an S-shape in a location along the long sides of the mass bar, the sensitivity in the X-axis is not affected, and the effect of the acceleration in the Y-Axis is significantly reduced, thereby increasing the detection performance of the acceleration sensor.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

While the invention has been described in terms of various specific embodiments, those of skill in the art will recognize that many modifications can be made to adapt to a particular application or material to the teachings of the invention. For example, the above-described embodiments may be used in combination with each other. Therefore, the appended claims should be construed broadly to include variants and embodiments of the invention.

What is claimed is:

1. A microelectromechanical system (MEMS) acceleration sensor comprising:
   a mass bar:
   a first spring disposed on a first set of opposite sides of the mass bar and configured to secure the mass bar in a first direction, the first spring having a frame shape:
   an interdigital structure disposed along a second set of opposite sides of the mass bar in a second direction, the second direction being perpendicular to the first direction;
   a detection electrode corresponding to the interdigital structure;
   a second spring disposed on the second set of opposite sides and configured to secure the mass bar in the second direction, the second spring having an S-shape.

2. The acceleration sensor of claim 1, wherein the mass bar has a rectangular shape.

3. The acceleration sensor of claim 1, wherein the second spring is disposed symmetrically about an axis of the mass bar in the second direction.

4. The acceleration sensor of claim 1, wherein the second spring is disposed in a middle section of the interdigital structure.

5. The acceleration sensor of claim 1, wherein the mass bar, the first spring, the interdigital structure, the detection electrode, and the second spring comprise a same material.

6. A method for manufacturing a microelectromechanical system (MEMS) acceleration sensor, the method comprising:
   providing a substrate;
   forming a sacrificial layer on the substrate;
   forming a sensor material layer on the sacrificial layer;
   patterning the sensor material layer using an etching process to form the accelerator sensor, wherein the accelerator sensor comprises:
   a mass bar;
   a first spring disposed on a first set of opposite sides of the mass bar and configured to secure the mass bar in a first direction, the first spring having a frame shape;
   an interdigital structure disposed along a second set of opposite sides of the mass bar in a second direction, the second direction being perpendicular to the first direction;
   a detection electrode corresponding to the interdigital structure;
   a second spring disposed on the second set of opposite sides and configured to secure the mass bar in the second direction, the second spring having an S-shape; and
   removing a portion of the sacrificial layer located below the mass bar, the first spring, the interdigital structure, and the second spring.

7. The method of claim 6, wherein the mass bar has a rectangular shape.

8. The method of claim 6, wherein the second spring is disposed symmetrically about an axis of the mass bar in the second direction.

9. A method for manufacturing a microelectromechanical system (MEMS) acceleration sensor, the method comprising:
   forming a sacrificial layer on a substrate;
   patterning a trench in a region where a to-be-formed acceleration sensor is connected to the substrate;
   forming a connection member in the trench;
   forming a sensor material layer on the substrate and the connection member;
   patterning the sensor material layer using an etching process to form the acceleration sensor, wherein the acceleration sensor comprises:
   a mass bar;
   a first spring disposed on a first set of opposite sides of the mass bar in a first direction and configured to secure the mass bar, the first spring having a frame shape;
   an interdigital structure disposed along a second set of opposite sides of the mass bar in a second direction, the second direction being perpendicular to the first direction;
   a detection electrode corresponding to the interdigital structure;
   a second spring disposed within the interdigital structure and connected to the opposite sides in the second direction, the second spring having an S-shape; and
   removing the sacrificial layer.

10. The method of claim 9, wherein the mass bar has a rectangular shape.

11. The method of claim 9, wherein the second spring is disposed symmetrically about an axis of the mass bar in the second direction.

* * * * *